United States Patent [19]

Ushijima et al.

[11] Patent Number: 4,985,722

[45] Date of Patent: Jan. 15, 1991

[54] APPARATUS FOR COATING A PHOTO-RESIST FILM AND/OR DEVELOPING IT AFTER BEING EXPOSED

[75] Inventors: Mitsuru Ushijima, Tokyo; Masami Akimoto, Kikuchi, both of Japan

[73] Assignees: Tokyo Electron Limited, Tokyo; Tel Kyushu Limited, Kumamoto, both of Japan

[21] Appl. No.: 308,470

[22] Filed: Feb. 10, 1989

[30] Foreign Application Priority Data

Feb. 12, 1988 [JP] Japan .................................. 63-30219

[51] Int. Cl.⁵ ........................ G03D 5/04; B65G 25/00
[52] U.S. Cl. .................................. 354/319; 354/325; 134/66; 134/79; 134/902; 414/416; 414/225
[58] Field of Search ............... 354/319, 320, 322, 325, 354/330; 134/66, 79, 902, 58 R; 414/416, 417, 217, 225, 331

[56] References Cited

U.S. PATENT DOCUMENTS 4,764,076  8/1988  Layman et al. ..................... 414/225
4,917,556  4/1990  Stark ................................... 414/217

*Primary Examiner*—A. A. Mathews

*Attorney, Agent, or Firm*—Oblon, Spivak, McClelland, Maier & Neustadt

[57] ABSTRACT

An apparatus is disclosed which forms a photo-resist film on a substrate surface and/or develops it. A passage provided such that it extends in a predetermined direction to allow conveying of a substrate having a surface on which a photoresist film is to be formed or a substrate having a photo-resist film to be developed, a plurality of treating units necessary for forming a photo-resist film and/or a plurality of treating units necessary for developing the photo-resist film, these units being provided along the passage, conveying means movable along a predetermined course for conveying the substrate in a predetermined direction, substrate handling means provided on the conveying means for holding a substrate and for setting a substrate into the treating unit, said substrate handling means being movable and rotatable in any direction, and control means for selecting said plurality of treating units in any combination and for controlling operations of the conveying means and substrate handling means so that the substrate undergoes predetermined treatments at the selected units in any sequence.

11 Claims, 5 Drawing Sheets

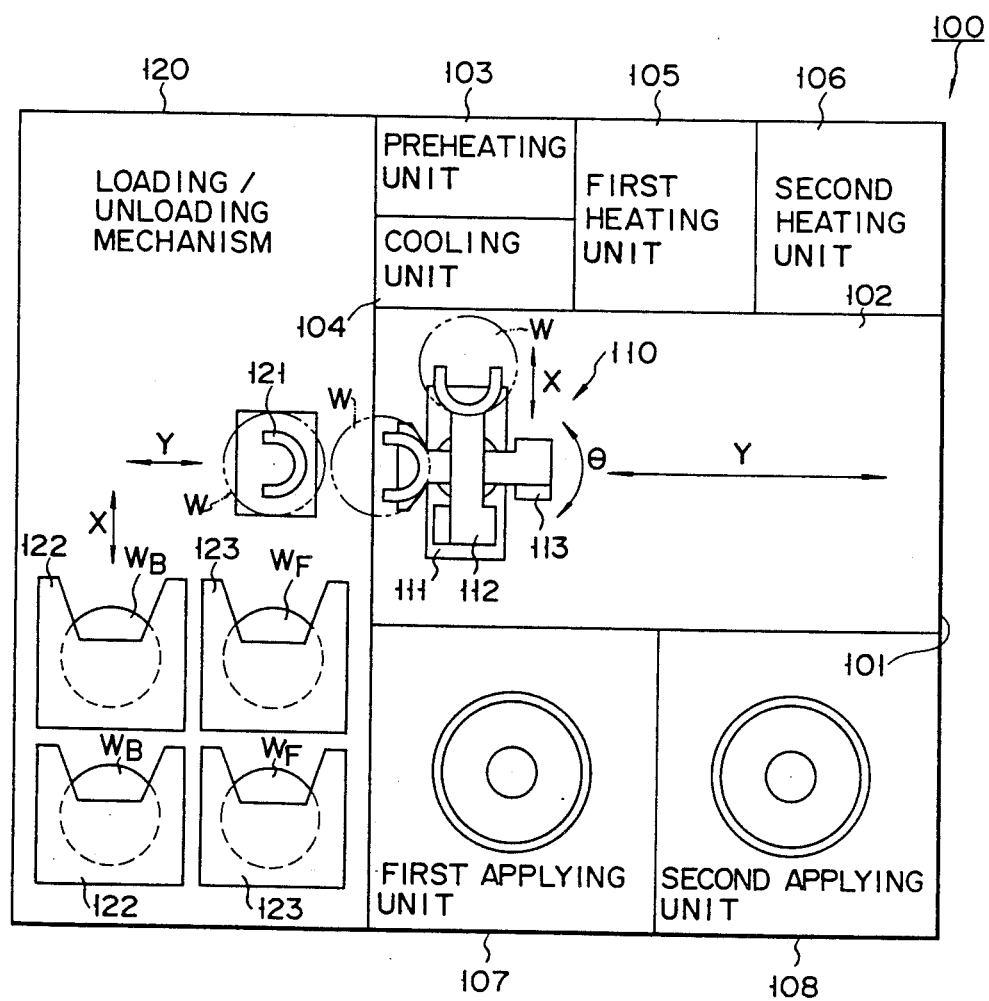
F I G. 2

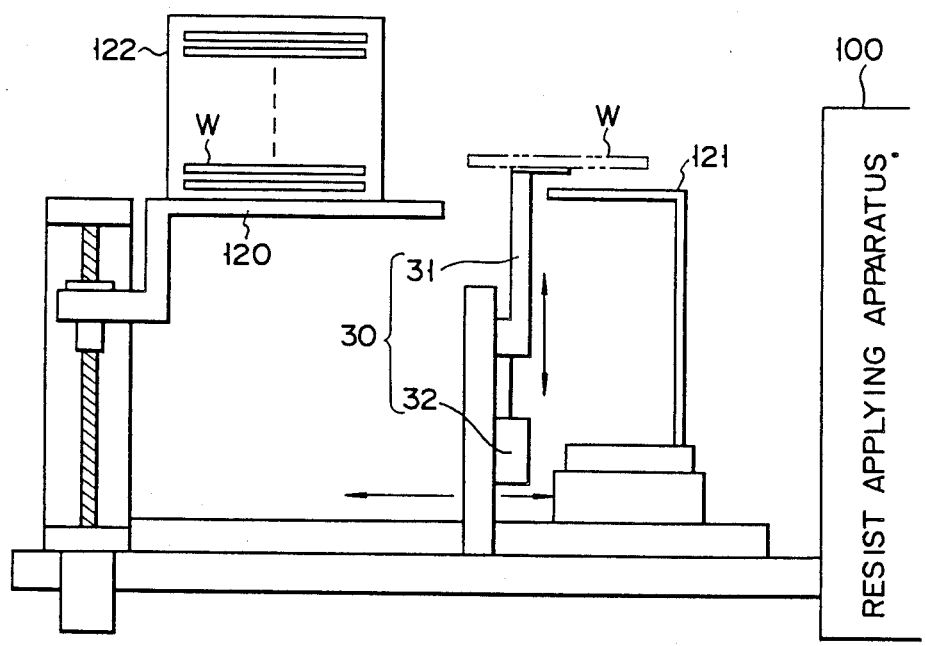
F I G. 5
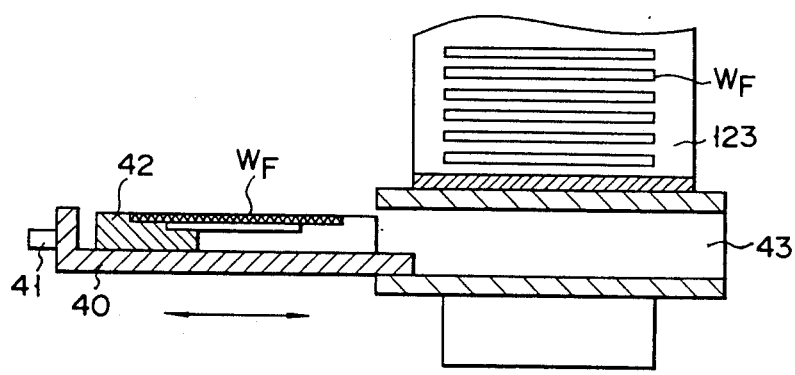
F I G. 6

APPARATUS FOR COATING A PHOTO-RESIST FILM AND/OR DEVELOPING IT AFTER BEING EXPOSED

BACKGROUND OF THE INVENTION

1. Field of the Invention

The present invention relates to an apparatus for coating a photo-resist film on the surface of a substrate and/or, for developing the photo-resist film subsequent to being exposed with a predetermined pattern, which is used in the manufacture of a semiconductor device, such as an integrated circuit. In particular, the apparatus of the invention is effectively used in manufacturing various types of ASICs with small production in each type.

2. Description of the Related Art

In the manufacture of a semiconductor device, such as an integrated circuit (IC), numerous steps for microfabrication are performed to form a device, such as a transistor, in a wafer of, for example, a silicon single crystal. Of these steps, a photoengraving process (PEP) is of greater importance because of PEP provides the base of a present microfabrication technique. In the PEP, a predetermined resist pattern is formed on the surface of the wafer, the resist pattern being employed as, for example, an etching mask.

The formation of the resist pattern by the PEP comprises the steps of coating a photo-resist on the wafer surface to provide a photo-resist film of uniform thickness, selectively exposing the photo-resist film at a predetermined area and developing the exposed photo-resist film to form a desired pattern. In this exposing step, use is made of an exposing device, such as a step and repeat aligner (that is, a stepper). On the other hand, the step for forming the photo-resist film on the substrate surface is carried out with, for example, an apparatus as will be explained below in more detail.

FIG. 1 is a flowchart showing the processing steps of a photo-resist film formation apparatus called a track system, including treating units carrying out a preheating step 4, cooling step 5, coating step 6 and heating step 8. Semiconductor wafers 1 are introduced into the aforementioned apparatus such that each is held within a cassette-like container 2. The semiconductor wafers 1 are taken out of the cassette 2 sheet by sheet and conveyed by a belt conveying mechanism 3 sequentially to the respective units for performing the respective treatment to be carried out there. At the preheating step 4, the wafer 1 has its moisture removed by heating and, subsequent to being cooled by the cooling step 5, is conveyed to the coating unit where a photo-resist is evenly coated on the surface of the wafer 1 by means of, for example, a spinner coater. The photo-resist-coated wafer 1 is sent to the heating unit 8 having a conveyor mechanism 7 called a walking beam system. At the heating unit 8, the photo-resist solution on the wafer is converted into a stable film. At the completion of the heating step 8, a wafer 9 with a desired photo-resist thin film formed thereon is conveyed into cassette 10 where it is stored as a "treated" wafer.

As set out above, in the conventional apparatus, the respective independent treating units are installed in a serial array and a semiconductor wafer to be treated has to be conveyed inevitably past all these units in a "one-way" course in a predetermined order whether all these treatment is required or not. It is, therefore, not possible to freely change a "once-set" treating order or to cause the wafer to pass selectively through only a predetermined unit or units.

The treating process necessary for forming an IC in the semiconductor wafer 1, including its treating sequence, differs depending upon the kinds of IC's to be formed on the wafer. In spite of some step or steps being unnecessary, it is unavoidable in the conventional apparatus that all the aforementioned steps have to be carried out on the semiconductor wafer. This cause a bar to the implementation of improved throughput.

Under this situation, there has been a growing demand for an apparatus which can freely select any particular treating unit or units and can freely change the order for passing through the units in accordance with the kinds of wafers to be treated.

SUMMARY OF THE INVENTION

It is accordingly the object of the present invention to provide an apparatus having all treating units necessary to form a photo-resist film on a wafer surface and/or develop it subsequent to being exposed with a predetermined pattern, in which the wafer can selectively be treated in any specific treatment order at any specific unit or units in accordance with the kinds of the wafers to be treated.

In order to achieve the aforementioned object, an apparatus for forming a photo-resist film on a semiconductor wafer surface and/or for developing the photo-resist film subsequent to being exposed with a predetermined pattern comprises:

a passage provided in such a manner that it extends in a predetermined direction to allow conveying of a substrate having a surface on which a photo-resist film is to be formed or a substrate having a photo-resist film to be developed;

a plurality of treating units necessary for forming a photo-resist film and/or a plurality of treating units necessary for developing the photoresist film, these units being provided along the passage;

conveying means movable along a predetermined course for conveying the substrate in a predetermined direction;

substrate handling means provided on the conveying means for holding a substrate and for setting a substrate which is held thereon into the treating unit, said substrate handling means being movable and rotatable in any direction; and control means for selecting said plurality of treating units in any combination and for controlling operations of the conveying means and substrate handling means so that the substrate undergoes predetermined treatments at the selected units in any sequence.

According to the present invention it is preferable to provide a plurality of substrate handling means.

It is also preferable to locate said plurality of treating units in a face-to-face relation across and along the passage for conveying the substrate.

BRIEF DESCRIPTION OF THE DRAWINGS

FIG. 2 is a plan view showing an apparatus according to an embodiment of the present invention;

FIG. 5 shows an interface mechanism as used in the embodiment of the present invention;

FIG. 6 is a view showing a cassette suitably employed in the embodiment of the present invention.

DETAILED DESCRIPTION OF THE PREFERRED EMBODIMENT

Figure 1:
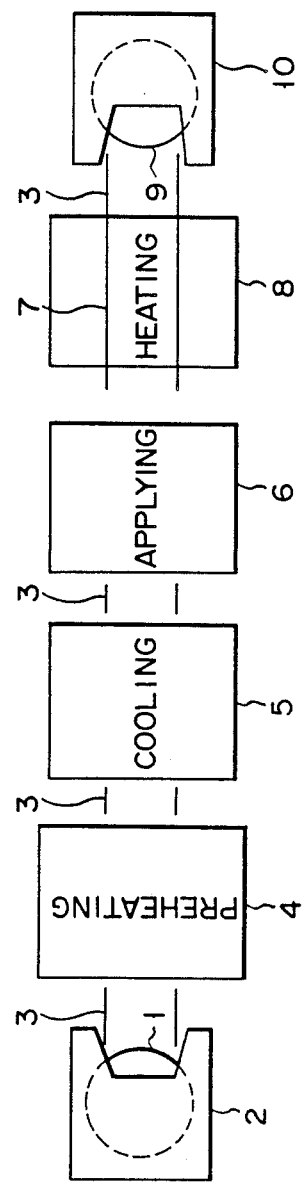
FIG. 1 is a block diagram showing a conventional apparatus a photo-resist film.
Figure 3:
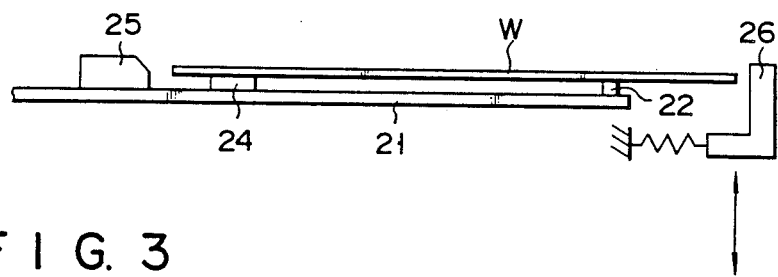
FIGS. 3 and 4A to 4C show a pair of tweezers used in the embodiment of the present invention.

FIG. 2 shows a plan view showing an apparatus 100 according to an embodiment of the present invention which is adapted to apply a photo-resist film on a semiconductor wafer surface and/or to develop the photo-resist film subsequent to being exposed with a specific pattern. In FIG. 2, reference numeral 101 shows a body base of the apparatus. A passage 102 is provided at the middle of the body base 101 and extends in a lateral direction as indicated by an arrow Y in FIG. 2. On one side of the passage 102 are provided a preheating station 103 for eliminating moisture, etc. from untreated semiconductor wafer by heating the wafer with or without HMDS treatment, a cooling unit 104 for cooling the preheated wafer, and first and second heating units 105 and 106 for heating the wafer subsequent to, for example, being coated with the photo-resist solution to dry it. Each of the heating units 105 and 106 has upper heating plate and lower heating plate arranged in an overlapping fashion. On the other side of the passage 102, first and second applying units 107 and 108 are provided. The two applying unit 107, 108 is provided in order to coat, a photo-resist solution on the surface of the wafer which has been preheated and cooled, or in order to spray a developing solution to an exposed photo-resist film on the wafer. Though the preheating unit 103 and cooling unit 104 are shown provided in a plan array in FIG. 2 for convenience's sake, as a matter of fact, the preheating unit 103 is provided over the cooling unit 104.

A wafer conveying device 110 is mounted on the passage 102 to allow the wafer to be travelled in the Y direction by a drive mechanism, not shown, such as a ball screw. The wafer conveying device 110 includes a carriage 111 having two pairs of tweezers 112, 113 adapted to hold the wafer in place under a suction force. The two pairs of tweezers are arranged one at the upper side and one at the lower side in an overlapping fashion. The two pairs of tweezers 112, 113 can be moved independently to each other in the X direction (the width direction of the passage 102), simultaneously in the Y direction (longitudinal direction of the passage 102) and the Z direction (vertical direction), and further can be rotated independently or simultaneously in the θ direction as shown in FIG. 2. In order to allow the tweezers 112 and 113 to be moved as described above, a stepping motor and drive mechanism, not shown, such as a ball screw, are coupled to the carriage 111. The conveying device 110 is employed to convey the wafer W to a respective one of the aforementioned treatment units.

A wafer loading/unloading mechanism 120 is provided to the left side of body base 101 and houses a plurality of wafer cassettes 122, 123 with those untreated semiconductor wafers $W_B$ held in the respective wafer cassettes 122 and those treated wafers $W_F$ held in the respective wafer cassettes 123. A pair of tweezers 121 is provided in the wafer loading/unloading mechanism 120 to hold the wafer W under a suction force imposed to the lower surface of the wafer. Like the tweezers 112 and 113, tweezers 121 can be moved in the X and Y directions and can pick up the untreated wafer $W_B$ from the cassette 122 and store the treated wafer $W_F$ into the wafer cassette 123.

The pair of tweezers 121 of the wafer loading/ unloading mechanism 120 delivers the untreated wafer $W_B$ to those tweezers 112, 113 of the conveying device 110 and receives the treated wafer $W_F$ from those tweezers 112, 113 of the conveying device 110. That deliver/receive interface is provided at a boundary between the passage 102 and the wafer loading/unloading mechanism 120.

The delivering/receiving operation of the wafers is achieved relative to the respective treatment units by the tweezers 112 and 113 of the conveying device 110. The wafer W undergoes various treatments at the respective units 103 to 108 in accordance with a predetermined order. The operation of conveying wafers is all controlled by a control system, not shown. The various treatments at the treatment units 103 to 108 can freely be set by modifying the program of a control system. That is, the treatments can be effected at some treatment units alone in accordance with a modified treatment sequence.

Figure 4A:
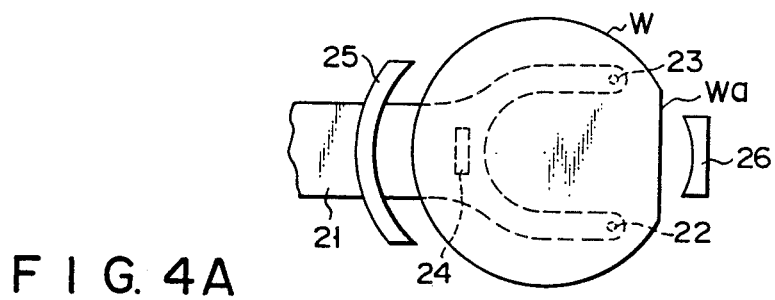
Figure 4B:
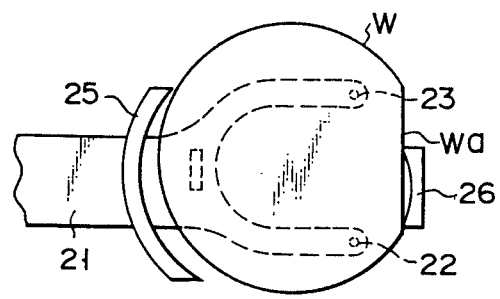
Figure 4C:
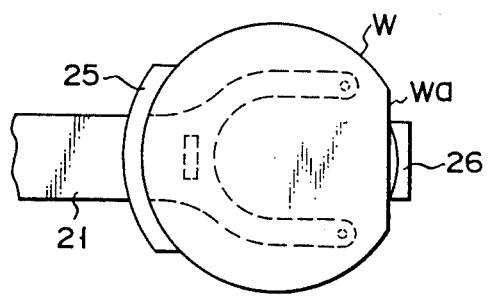

FIGS. 3 and 4A to 4C show the aforementioned tweezers 112, 113 and 121 in more detail. In these Figures, a body 21 of the tweezers has three projecting support pins 22, 23 and 24 whereby the semiconductor wafer W is supported. The three-point-support is effective to prevent contamination of the wafer surface with dust. One of the three support pins have their open top end to allow the wafer to be vacuum-sucked there. An arcuate guide member 25 conforming to the peripheral edge of the wafer W is provided which, together with a stopper member 26, ensures the alignment of the wafer W. The wafer W is placed just on the tweezers in such a state as shown in FIG. 4A at which time it is neither aligned in a correct position nor vacuum-sucked. Then as shown in FIG. 4B, the pair of the tweezers is horizontally moved toward the stopper member 26 to allow the orientation flat Wa of the wafer to abut against the stopper member 26. The further horizontal movement allows the wafer W to slide over the support pins 22 to 24 into abutting engagement with the guide member 25 where it is stopped. Even if in the state shown in FIG. 4A the wafer W tends to be displaced away from a correct center of the tweezers, it is guided by the guide member 25 to align with a predetermined center position of the tweezers.

FIG. 5 shows an interface mechanism 30 which is provided at a boundary between the passage 102 and wafer loading/unloading mechanism 120. The interface mechanism has the function of allowing the wafer W to temporarily wait so that it is transferred between the tweezers 121 and the tweezers 112 and 113. In order to achieve this object, the interface mechanism comprises a holding member 31 for holding the wafer W with an assist of a vacuum suction mechanism and drive device 32, such as an air cylinder, for raising and lowering the holding member. When the wafer W is conveyed to the position shown in FIG. 5 by the tweezers 121 of the loading/unloading mechanism 120, the holding member 32 is raised to permit the semiconductor wafer W to be lifted for the wafer W to be held in place Then the wafer conveying device 110 on the side of the resist coating device 100 is moved to the position of the interface mechanism shown. The lowering of the holding member 31 allows the wafer which is held by the holding member 31 to be placed on the tweezers 112 or 113.

The transfer of the wafer W from the tweezers 112, 113 to 121 is performed in the same fashion as set forth.

The step for forming a photo-resist film on the surface of a semiconductor wafer W by the device 100 will sequentially be explained below. The aforementioned step is performed based on a program which is initially stored i the aforementioned control system.

First a semiconductor wafer is picked up from the cassette 122 by the tweezers 121 in the loading/ unloading mechanism 120 and brought to the position of the interface mechanism. The wafer W being conveyed is delivered via the interface mechanism to one of pairs of tweezers, for example, tweezers 112, waiting at a location to the left end of the passage 102 and held there under a suction force. If the same types of semiconductor wafers are held in one cassette 122, an ID code can be attached to the cassette 122. It is thus possible to, upon the reading of the ID code from the cassette, select a corresponding manufacturing process program.

An explanation will be given below of the case where the wafer is treated in a sequence of the preheating unit 103, cooling unit 104, first coating unit 107 and first heating unit 105.

First the pair of tweezers 112, subsequent to picking up a first wafer W, is delivered to the preheating unit 103 where the wafer is set for preheating. The preheating unit 103 includes a heater plate on which the wafer is set. Preferably, the heater plate has three support pins by which the wafer is supported. When the wafer is supported by the three-point-support at a short distance from the heater plate surface by approximate 0.3 mm, wafer contamination with dust can be effectively prevented. During that period of time, the pair of tweezers 121 is moved toward the cassette 122 where it picks up a second wafer W and waits for the next operation at the interface mechanism. After the first wafer has been delivered to the preheating unit 103, the conveying device 110 receives the second wafer by tweezers 112 from the interface mechanism, and the wafer is held by the tweezers 112 under a suction force. The second wafer is held there until the first wafer has been treated at the preheating unit 103.

When the preheating of the first wafer W is completed, the conveying device 110 performs the next operation. That is, the pair of tweezers with no wafer placed thereon is moved so that the "preheated" first wafer is picked up from the preheating unit 103. When the preheating unit 103 is so vacated, the pair of tweezers 112 with the second wafer held thereon is moved to set the second wafer to the preheating unit 103. Then, tweezers 112, 113 is moved in the Y-direction, θ-direction and Z-direction, thereby locating at the cooling unit 104. Subsequently, the tweezers 113 with the pretreated first wafer placed thereon is moved in the X-direction so as to set the first wafer to the cooling unit 104. From the above description, it will be seen that there is an advantage of so providing two tweezers 112 and 113. That is, if, on the other hand, use is made of one pair of tweezers, the conveying device 110 has to be of such type that it first picks up a first wafer from the preheating unit 103, sets it to the cooling unit 104, picks up a second wafer and set it to the preheating unit.

During the aforementioned operation, at the wafer loading/unloading mechanism 120, a third wafer to be next treated by the tweezers 121 is placed at the interface mechanism in preparation for the next operation.

Next the wafer conveying device 110 picks up the third wafer by the tweezers 112 from the interface mechanism for holding it thereon and waits in that state until a treatment is completed at the cooling unit 104. When the cooling of the first wafer is completed, the wafer conveying device 110 picks up the wafer in the cooling unit 104 by empty tweezers 113 and sets it in the first coating unit 107 for a programmed photo-resist coating step to be carried out. When the treatment of the second wafer in the preheating unit 103 is completed during that coating period, then the conveying device 110 picks up that wafer by empty tweezers 113 from the preheating unit 103. A third wafer held by the tweezers 112 is sets in the preheating unit 103 and, at the same time, the second wafer held by the tweezers 113 is set in the cooling unit 104. The aforementioned operation is the same as already set out above.

If the preheating of the second wafer is completed prior to the completion of a cooling operation on the first wafer, a program may be run as will be set forth below. That is, a second wafer is picked up from the preheating unit 103 by the tweezers 113 with a nontreated third wafer held by the tweezers 112. The third wafer is set by the tweezers 112 in the heating unit 103 and a wait is made for the next operation to be made. Subsequent to cooling the first wafer in the unit 104, it is picked up by the tweezers 112 or 113 and set in the first applying unit 107. In the first applying unit, photo-resist solution is dropped and coated on the wafer surface by spinner coater.

When the first wafer is coated with a photo-resist in the first applying unit 107, the conveying device 110 picks up that wafer from the first applying unit 106 by the tweezers 113. The conveying device is moved to the right in the Y direction and the picked-up first wafer is set in the first heating unit 105 for heat treatment. After the cooling of the second wafer in the cooling unit 104 during the time period in which the first wafer is heated as set out above, the conveying device 110 picks up the second wafer and sets it in the first applying unit 107 where it is coated with a photo-resist.

After the first wafer has been heat-treated in the first heating unit 105 and coated with a desired photo-resist film, the conveying device 110 picks up the first wafer by tweezers 113 and is moved to the left in the Y direction and delivers the wafer which is held by tweezers 113 to the interface mechanism. In the interface mechanism, the wafer is preferably supported on the holding member at a short distance from the surface of the holding member in order to prevent contamination with dust. It is more preferable that waiting mechanism comprises a carrier cassette. The loading/unloading mechanism 120 picks up the treated wafer $W_F$ at the interface mechanism by means of tweezers 121 and located into the cassette 123 for storage. The aforementioned operation is performed in a sequential fashion until untreated wafers $W_B$ in the cassette 122 are all treated.

Although, in the aforementioned explanation, use has been made of the first applying unit 107 and first heating unit 105, the second applying unit 108 and second heating unit 106 may be used instead. If the photo-resist coating step and/or heating step take more time than at the other step or steps, then it may be possible to simultaneously employ two applying units 107 and 108 for coating the photo-resist solution and/or two heating units 105 and 106.

It is common practice to tentatively treat a wafer, in the step of forming the aforementioned photo-resist film thereon, so as to see whether or not a programmed process is proper. In this case it is necessary to pick up the "tentatively treated" test wafer W$_T$ from the cassette for inspection. In order to gain easy access to the wafer for pick-up, it is preferable to provide at the base of a cassette 123 a receiver 40 which can be drawn relative to the cassette. A knob 41 is provided at one end of the receiver 40 in which a wafer rest 42 is placed. The "tentatively treated" test wafer W$_T$ is placed via an opening 43 on the wafer rest 42 by the tweezers 121. The test wafer W$_T$ can be picked up readily by drawing the receiver 40 as shown in FIG. 6.

As already set forth above, although the first coating unit 107 and first heating unit 105 are employed in performing the aforementioned operation, it may be possible to use the second coating unit 108 and second heating unit 106 instead. If the photoresist coating step and/or heating step take more time than the other step or steps, it may be possible to simultaneously employ the two coating units 107, 108 and/or two heating units 105, 106.

As will be appreciated from the above, according to the present invention, a plurality of steps necessary to form a photo-resist film on the surface of the semiconductor wafer can be employed in a proper combination with other steps. That is, a heat treatment program can be selected in accordance with the kinds of wafers to obtain the best throughput from the most efficient combination.

The tweezers 112, 113 on the conveying device 110 can perform their own individual operation with high latitude. For example, if a preceding wafer is being treated at one unit, it cannot be replaced by a "current" wafer due to the presence of the preceding wafer. Even under the situation, it is possible, according to the present invention, to avoid such an inconvenience. Three or more pairs of tweezers can be employed in a proper fashion instead of two.

The various treatment units are provided along the passage 102 with a proper number placed on each side of the passage and hence an operation program of the conveying device 110 ca freely and readily be modified with greater latitude. Furthermore, since the preheating unit 103 and cooling unit 104 are provided one above the other, a floor space for installation can be saved a great deal.

The aforementioned apparatus of the present invention can also be employed for developing a photo-resist film which has been exposed with a predetermined pattern. In this case, the applying units 107 and 108 are employed for developing the wafer with a developing solution and for forming a resist pattern. For attaining this object, the developing apparatus is also provided in the units 107, 108. Employed is such a developing apparatus which develops an exposed photoresist film by spraying jet-stream of a developing solution onto the wafer being rotated with variable speed.

Furthermore, the two applying units 107 and 108 are employed such that one is used for coating a photoresist and the other for applying a developing solution on the wafer. As a result, the resultant apparatus can be used for performing both the functions. In this case, another interface mechanism can be provided on the right-hand end of the passage 102 as shown in FIG. 5 and if the delivery of the wafer to the exposure device is ensured, then it is possible to perform a complete series of operation from the coating of the resist to the developing of the resist.

Figure 7:
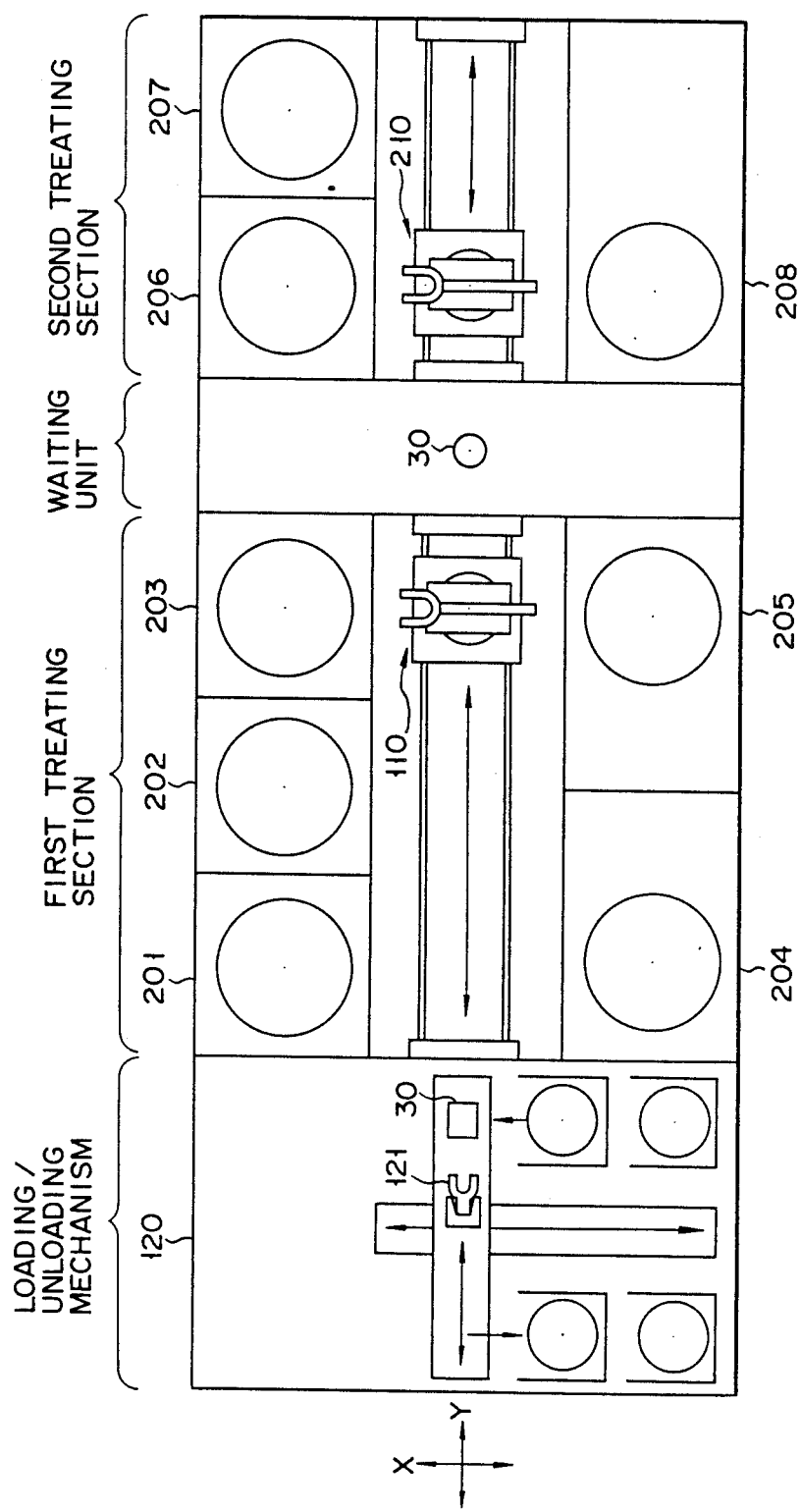
FIG. 7 is a plane view showing an apparatus according to another embodiment of the present invention.

It should be also noted that plurality of the treating sections 100 can be combined in series. In this case, the two or more sections 100 is arranged so as to an elongated passage 102 is formed. It is preferable to provide a waiting mechanism, for example, a carrier unit between the each unit 100. An example of the embodiment is shown in FIG. 7. In the drawing, 201 is a HMDS treating unit, 202 is a first preheating unit, 203 is a first cooling unit, 204 is a first applying unit, 205 is a second applying unit, 206 is a second preheating unit, 207 is a second cooling unit, 208 is an applying unit for surface coating.

In addition, the apparatus of the invention can be used for washing or cleaning surfaces of a wafer.

What is claimed is:

1. A photo-resist processing apparatus comprising:
   a passage provided such that it extends in a predetermined direction to allow conveyance of a substrate to be treated;
   a plurality of treating units necessary for photo-resist processing, these units being provided along said passage;
   at least one conveying means for conveying the substrate along said passage in a selective manner according to a predetermined program;
   at least two handling means provided on said at least one conveying means for loading the substrate into the treating unit and for unloading the substrate from the treating unit, said at least two handling means being transferred together along said passage by said at least one conveying means and being movable independently of each other on said at least one conveying means for handling the substrate;
   controlling means for selecting said plurality of treating units in any combination and for controlling operations of said at least one conveying means and said at least two handling means so that the substrate undergoes predetermined treatments at the selected units in any sequence.

2. The apparatus according to claim 1, wherein said plurality of treating units are provided at each side of said passage, in a face-to-face relation across the passage.

3. The apparatus according to claim 1, wherein said handling means are vacuum-suction tweezers.

4. The apparatus according to claim 1, wherein, of said plurality of treating units, at least two are provided one over another.

5. The apparatus according to claim 1, further comprising a loading/unloading mechanism for picking up substrates one by one from a cassette holding a plurality of substrates to be treated and delivering it to the handling means and for receiving a substrate which has undergone all treatments from said handling means and storing it into a substrate holding cassette.

6. The apparatus according to claim 1, wherein the treating units comprise a unit for applying a photoresist solution, a unit for applying developing solution, a heating unit, a waiting unit and a cassette unit.

7. The apparatus according to claim 1, wherein the substrate is held on one of said at least two handling means while being conveyed by said at least one conveying means.

8. The apparatus according to claim 1 wherein the number of said at least two handling means is two.

9. The apparatus according to claim 1, wherein the number of said at least one conveying means is one.

10. The apparatus according to claim 8, wherein said at least two handling means are two pairs of tweezers which are arranged one at the upper side and one at the lower side in an overlapping fashion.

11. A photo-resist processing apparatus comprising:
- a passage provided such that it extends in a predetermined direction to allow conveying of a substrate to be treated;
- a plurality of treating units necessary for photo-resist processing, these units being provided along the passage;
- conveying means for conveying the substrate along the passage in a selective manner according to a predetermined program;
- at least two handling means each employing vacuum suction tweezers, provided on said conveying means for loading the substrate into the treating unit and for unloading the substrate from the treating unit, with one of said handling means loading the substrate into a certain treating unit, when the other handling means unloads the substrate from the same treatment unit;
- controlling means for selectively controlling said plurality of treating units in any combination and for controlling operations of the conveying means and the handling means such that the substrate undergoes predetermined treatments at the selected units in any sequence.

* * * * *